(12) United States Patent
Xiao et al.

(10) Patent No.: US 12,376,280 B2
(45) Date of Patent: Jul. 29, 2025

(54) MEMORY AND MEMORY FORMING METHOD

(71) Applicant: CHANGXIN MEMORY TECHNOLOGIES, INC., Hefei (CN)

(72) Inventors: Deyuan Xiao, Hefei (CN); Guangsu Shao, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 690 days.

(21) Appl. No.: 17/805,966

(22) Filed: Jun. 8, 2022

(65) Prior Publication Data

US 2023/0292485 A1 Sep. 14, 2023

Related U.S. Application Data

(63) Continuation of application No. PCT/CN2022/086255, filed on Apr. 12, 2022.

(30) Foreign Application Priority Data

Mar. 10, 2022 (CN) .......................... 202210237320.3

(51) Int. Cl.
H01L 21/311 (2006.01)
H10B 12/00 (2023.01)

(52) U.S. Cl.
CPC .......... *H10B 12/0387* (2023.02); *H10B 12/37* (2023.02)

(58) Field of Classification Search
CPC .... H10B 12/0387; H10B 12/37; H10D 1/716; H10D 1/043
See application file for complete search history.

(56) References Cited

U.S. PATENT DOCUMENTS

| 8,119,509 | B2 | 2/2012 | Cho |
| 2011/0117718 | A1 | 5/2011 | Nakamura et al. |
| 2011/0193159 | A1* | 8/2011 | Kujirai ............... H10D 84/0158 |
| | | | 257/E27.06 |

FOREIGN PATENT DOCUMENTS

| CN | 112018089 | A | 12/2020 |
| CN | 112420722 | A | 2/2021 |
| CN | 112750783 | A | 5/2021 |
| CN | 112908968 | A | 6/2021 |
| CN | 113659075 | A | 11/2021 |
| CN | 114068539 | A | 2/2022 |
| JP | 2011108927 | A | 6/2011 |
| KR | 20100013499 | A | 2/2010 |

OTHER PUBLICATIONS

International Search Report cited in PCT/CN2022/086255 mailed Nov. 25, 2022, 9 pages.

* cited by examiner

*Primary Examiner* — Samuel Park
(74) *Attorney, Agent, or Firm* — Kilpatrick Townsend & Stockton LLP

(57) ABSTRACT

The present disclosure relates to a memory and a memory forming method. The memory forming method includes: providing an initial substrate; etching the initial substrate to form a plurality of capacitor holes and a plurality of recesses that are connected to the capacitor holes in a one-to-one corresponding manner and located below the capacitor holes; forming an isolation layer that connects adjacent ones of the recesses and fills up the recesses, and using the initial substrate remaining below the isolation layer as a substrate; and forming a capacitor in the capacitor hole.

17 Claims, 10 Drawing Sheets

MEMORY AND MEMORY FORMING METHOD

CROSS-REFERENCE TO RELATED APPLICATIONS

The present application is a continuation application of International Patent Application No. PCT/CN2022/086255, filed on Apr. 12, 2022, which claims the priority to Chinese Patent Application No. 202210237320.3, titled "MEMORY AND MEMORY FORMING METHOD" and filed on Mar. 10, 2022. The entire contents of International Patent Application No. PCT/CN2022/086255 and Chinese Patent Application No. 202210237320.3 are incorporated herein by reference.

TECHNICAL FIELD

The present disclosure relates to the technical field of semiconductor manufacturing, and in particular, to a memory device and a memory forming method.

BACKGROUND

As a semiconductor device commonly used in an electronic device such as a computer, a dynamic random access memory (DRAM) includes a plurality of memory cells, and each of the memory cells usually includes a transistor and a capacitor. The transistor has a gate being electrically connected to a word line, a source being electrically connected to a bit line, and a drain being electrically connected to the capacitor. A word line voltage on the word line can control on and off of the transistor, such that data information stored in the capacitor can be read through the bit line or data information can be written into the capacitor through the bit line.

However, in an existing memory such as the DRAM, especially in a memory with a transistor on capacitor (TOC) structure, electric leakage is easy to occur at the bottom of the capacitor, which reduces performance of the memory.

Therefore, how to reduce the electric leakage at the bottom of the capacitor to improve an electrical property of the memory is an urgent technical problem to be resolved.

SUMMARY

According to some embodiments, the present disclosure provides a memory forming method, including:
 providing an initial substrate;
 etching the initial substrate to form a plurality of capacitor holes and a plurality of recesses that are connected to the capacitor holes in a one-to-one corresponding manner and located below the capacitor holes;
 forming an isolation layer that connects adjacent ones of the recesses and fills up the recesses, and using the initial substrate remaining below the isolation layer as a substrate; and
 forming a capacitor in the capacitor hole.

According to some other embodiments, the present disclosure further provides a memory, including:
 a substrate;
 an isolation layer, located above the substrate; and
 a capacitor array, located above the isolation layer and including a plurality of capacitors, where the capacitors each include a first electrode extending along a direction perpendicular to a top surface of the substrate, a dielectric layer covering a surface of the first electrode, and a second electrode covering a surface of the dielectric layer.

BRIEF DESCRIPTIONS OF THE DRAWINGS

Figure 1:
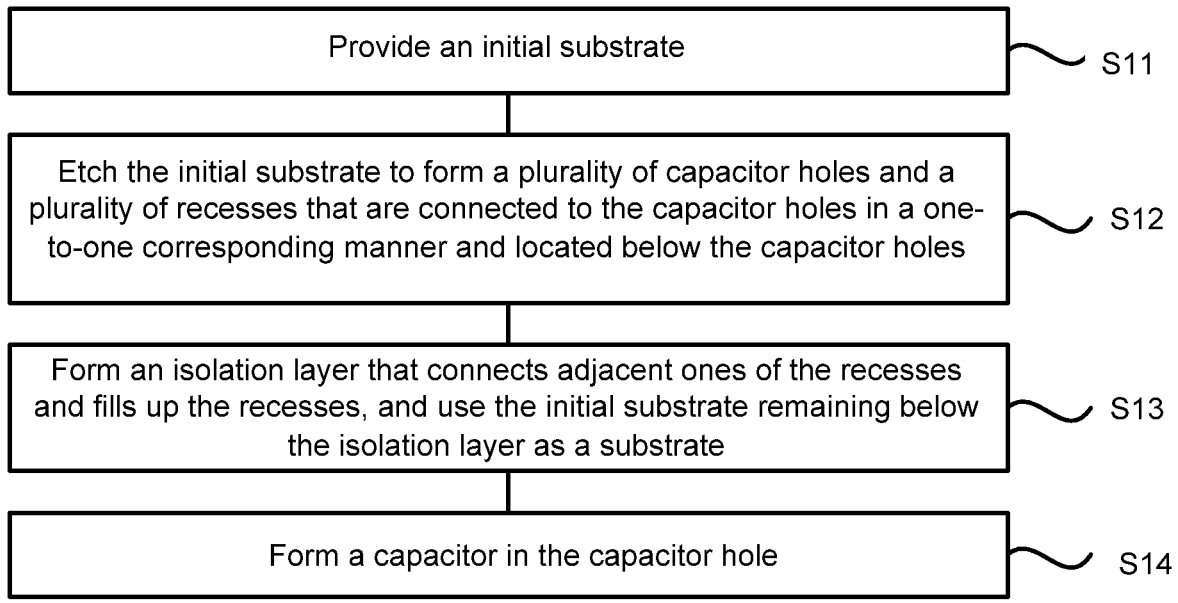
Figure 2A:
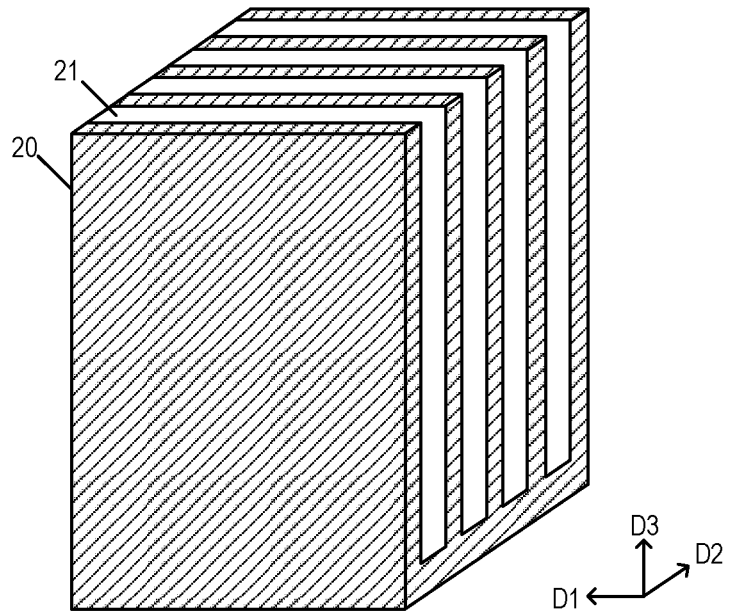
Figure 2B:
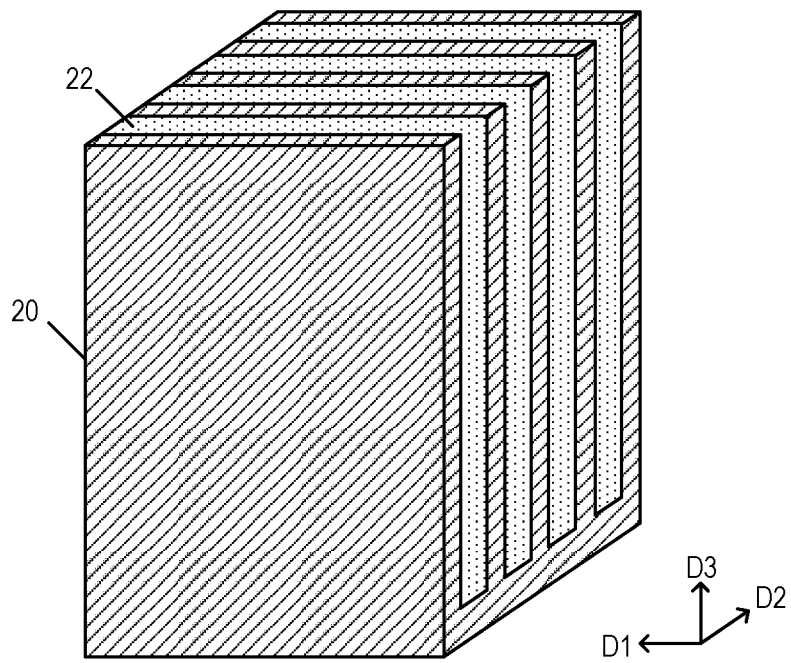

FIG. 1 is a flowchart of a memory forming method according to a specific implementation of the present disclosure;
FIG. 2A to FIG. 2Q are schematic structural diagrams of main processes for forming a memory according to a specific implementation of the present disclosure; and
FIG. 3 is a schematic structural diagram of a memory according to a specific implementation of the present disclosure.

DETAILED DESCRIPTION

Specific implementations of a memory and a memory forming method provided in the present disclosure will be described below in detail with reference to the accompanying drawings.

The specific implementations provide a memory forming method. FIG. 1 is a flowchart of a memory forming method according to a specific implementation of the present disclosure. FIG. 2A to FIG. 2Q are schematic structural diagrams of main processes for forming a memory according to a specific implementation of the present disclosure. The memory in the specific implementations may be, but not limited to, a DRAM. As shown in FIG. 1 and FIG. 2A to FIG. 2Q, the memory forming method provided in this specific implementation includes the following steps:

Step S11: Provide an initial substrate 20.

Specifically, the initial substrate 20 may be, but not limited to, a silicon substrate. This specific implementation is described by using an example in which the initial substrate 20 is the silicon substrate. In other examples, the initial substrate 20 may be a semiconductor substrate such as a gallium nitride substrate, a gallium arsenide substrate, a gallium carbide substrate, a silicon carbide substrate or a silicon-on-insulator (SOI) substrate.

Step S12: Etch the initial substrate 20 to form a plurality of capacitor holes 35 and a plurality of recesses 24 that are connected to the capacitor holes 35 in a one-to-one corresponding manner and located below the capacitor holes 35, and use a remaining part, below the recess 24, of the initial substrate as a substrate 25.

Figure 2C:
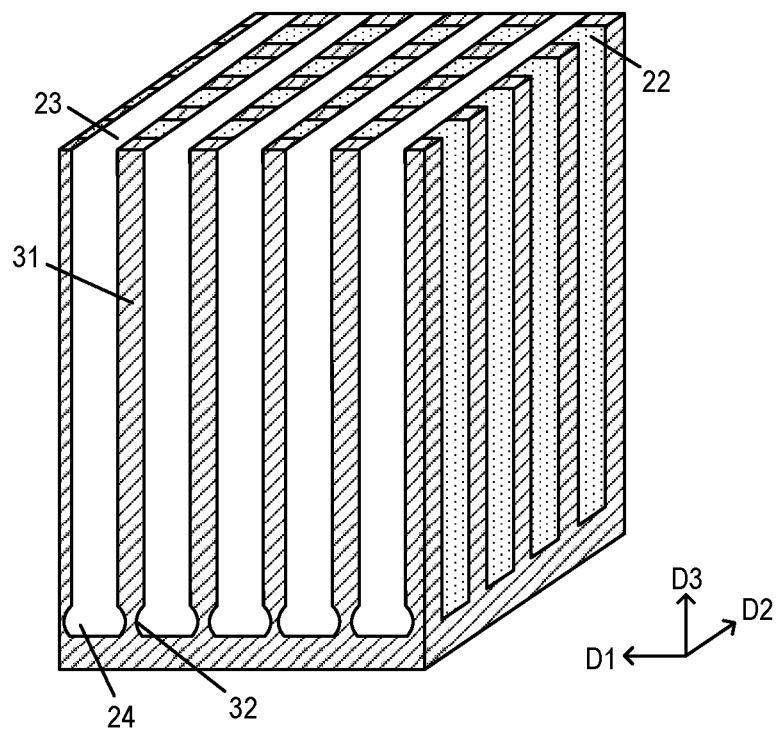
Figure 2D:
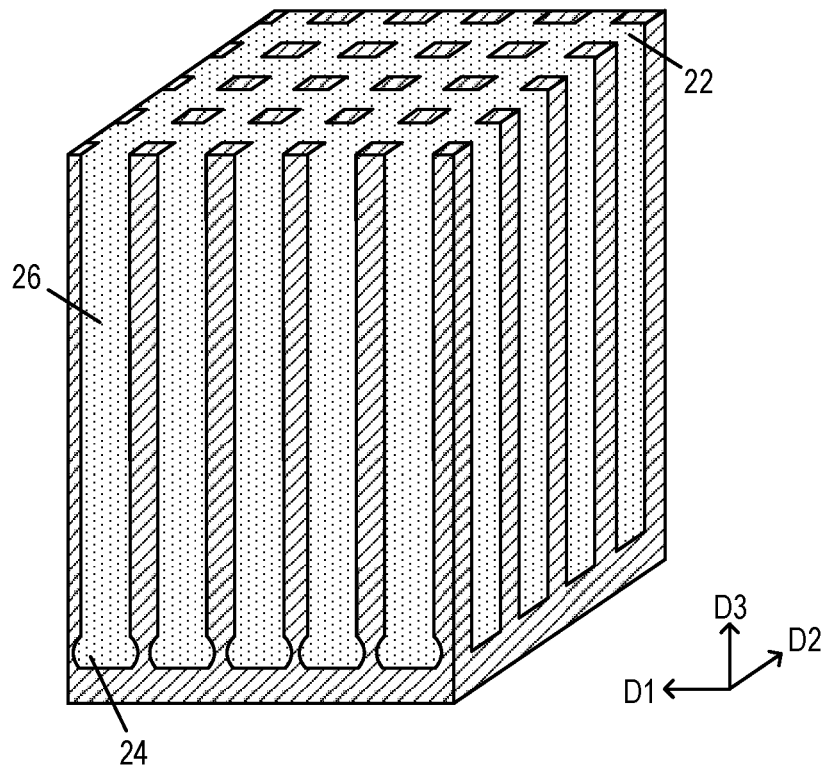
Figure 2E:
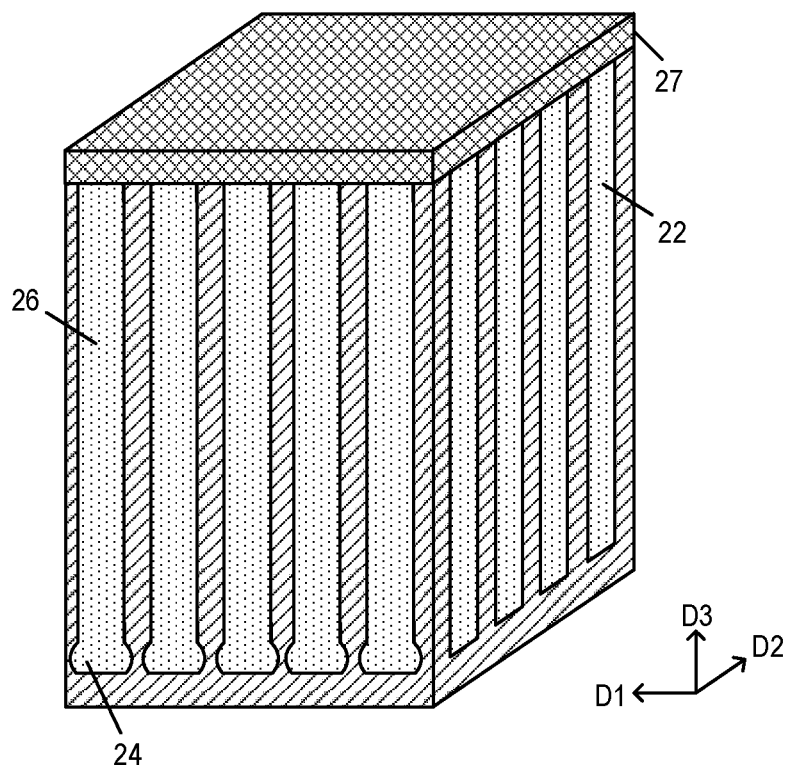
Figure 2F:
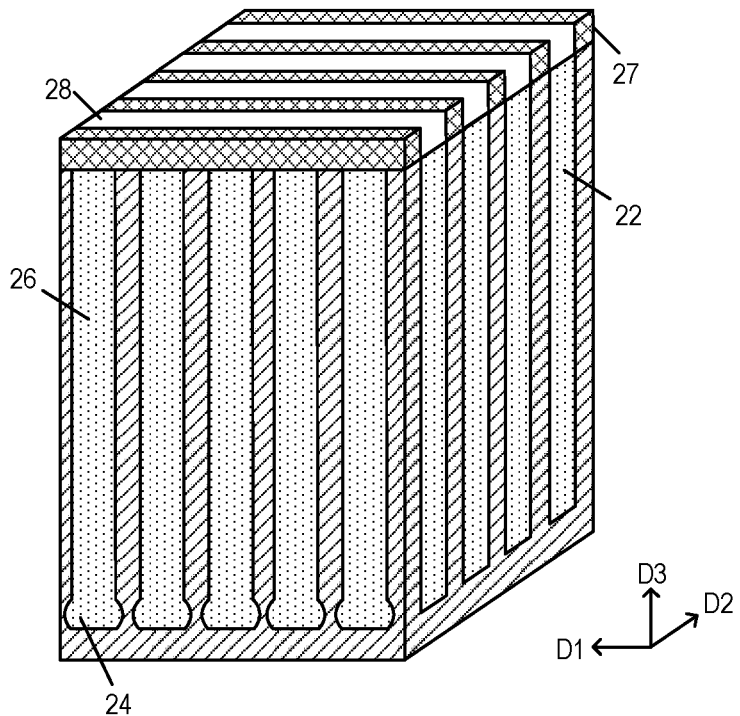
Figure 2G:
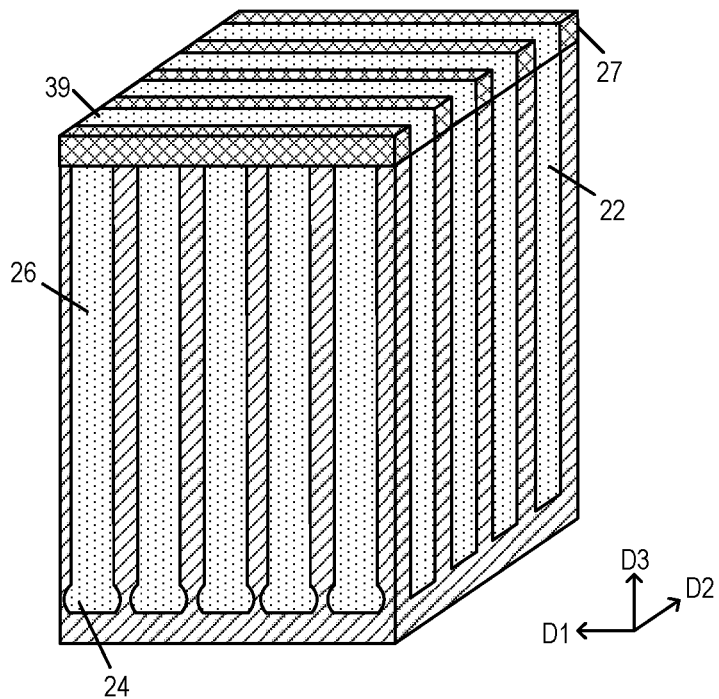
Figure 2H:
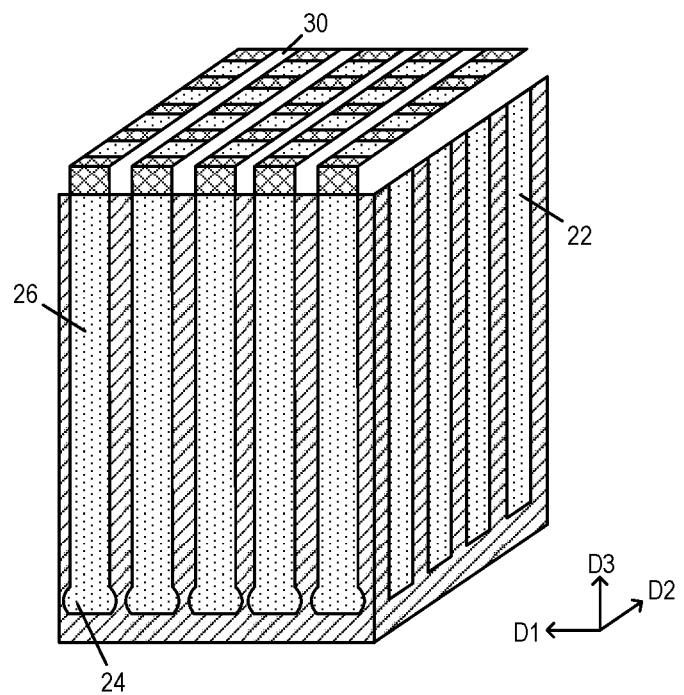
Figure 2I:
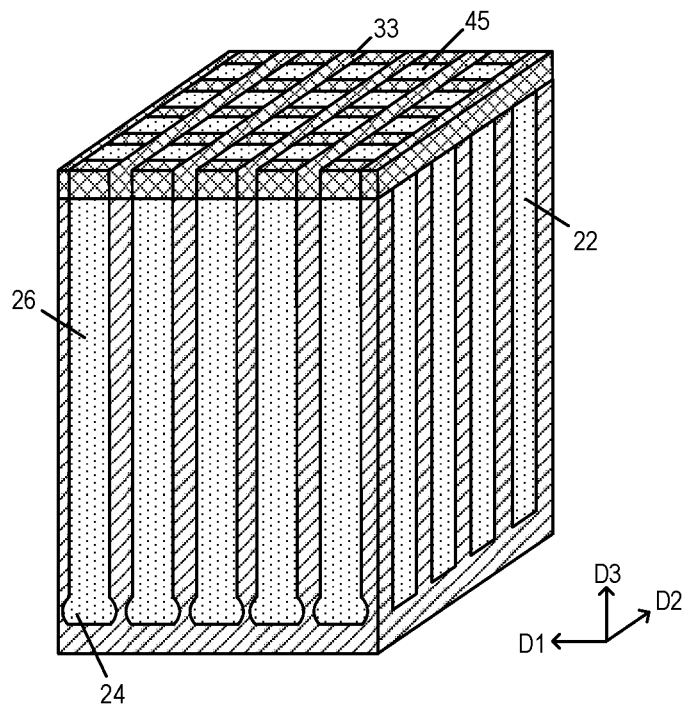
Figure 2J:
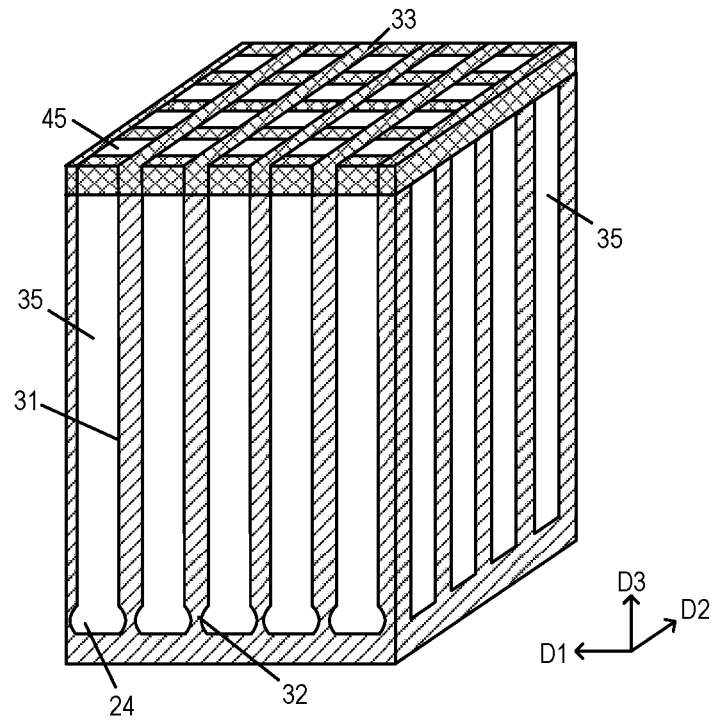

In some embodiments, the forming a plurality of capacitor holes 35 and a plurality of recesses 24 that are connected to the capacitor holes 35 in a one-to-one corresponding manner and located below the capacitor holes 35 specifically includes:
 etching the initial substrate 20 to form a plurality of first etching tanks 21, where the first etching tanks 21 each extend along a first direction D1, the first etching tanks 21 are parallel to each other and spaced apart in a second direction D2, the first direction D1 and the second direction D2 are parallel to a top surface of the initial substrate 20, and the first direction D1 is orthogonal to the second direction D2, as shown in FIG. 2A;
 etching the initial substrate 20 to form a plurality of second etching tanks 23, where the second etching tanks 23 each extend along the second direction D2, and the second etching tanks 23 are parallel to each other and spaced apart in the first direction D1;

etching the initial substrate 20 at the bottom of the second etching tank 23 to form the recess 24 whose inner diameter is greater than an inner diameter of the second etching tank 23, as shown in FIG. 2C; and connecting the first etching tank 21 and the second etching tank 23 to form the capacitor hole 35, as shown in FIG. 2J.

Specifically, the initial substrate 20 can be etched along a direction perpendicular to the top surface of the initial substrate 20 (for example, a third direction D3 in FIG. 2A) by using a dry etching process, to form the first etching tanks 21. The first etching tanks 21 each extend along the first direction D1, and the first etching tanks 21 are parallel to each other and spaced apart along the second direction D2. In a process of etching the initial substrate 20 to form the first etching tank 21, etching parameters such as a dosage of etching gas and/or etching time can be controlled to make the first etching tank 21 not penetrate through the initial substrate 20 in the direction perpendicular to the top surface of the initial substrate 20.

In some embodiments, before the forming a plurality of second etching tanks 23, the memory forming method further includes the following step:

forming a first filling layer 22 that fills up the first etching tank 21, as shown in FIG. 2B.

In some embodiments, the forming the recess 24 whose inner diameter is greater than an inner diameter of the second etching tank 23 specifically includes:

etching the initial substrate 20 at the bottom of the second etching tank 23 by using a Bosch etching process, to form the recess 24, as shown in FIG. 2C.

Specifically, in order to avoid collapse or tip-over when etching the initial substrate 20 to form the second etching tank 23, before the second etching tank 23 is formed, an insulating material such as silicon dioxide can also be deposited in the first etching tank 21 by using a chemical vapor deposition process, a physical vapor deposition process, or an atomic layer deposition process, to form the first filling layer 22 that fills up the first etching tank 21, as shown in FIG. 2B. Then, the initial substrate 20 can be etched along the direction perpendicular to the top surface of the initial substrate 20 (for example, the third direction D3 in FIG. 2A) by using the dry etching process, to form the second etching tanks 23. The second etching tanks 23 each extend along the second direction D2, and the second etching tanks 23 are parallel to each other and spaced apart along the first direction D1. That is, a projection of the second etching tank 23 along the direction perpendicular to the top surface of the initial substrate 20 is orthogonal to a projection of the first etching tank 21 along the direction perpendicular to the top surface of the initial substrate 20. After that, the initial substrate 20 at the bottom of the second etching tank 23 is continuously etched along the first etching tank 21 by using the Bosch etching process, to form the recess 24 that is connected to the bottom of the second etching tank 23 and whose inner diameter is greater than the inner diameter of the second etching tank 23. The inner diameter of the recess 24 is greater than the inner diameter of the second etching tank 23. Therefore, in the first direction D1, a width of the initial substrate 20 remaining between adjacent ones of the second etching tanks 23 (namely, a first isolation column 31) is greater than a width of the initial substrate 20 remaining between adjacent ones of the recesses 24 (namely, a second isolation column 32).

In this specific implementation, the recess 24 is formed by using the Bosch etching process after the second etching tank 23 is formed, so as to simplify a forming process of a memory. In other specific implementations, those skilled in the art can also select another etching process as needed to form the second etching tank 23 and the recess 24 connected to the second etching tank 23.

In some embodiments, the connecting the first etching tank 21 and the second etching tank 23 to form the capacitor hole 35 specifically includes:

forming a second filling layer 26 that fills up the second etching tank 23 and the recess 24, as shown in FIG. 2D;

forming, above the initial substrate 20, a patterned mask layer that includes a plurality of openings 45 exposing an overlapping region of the first etching tank 21 and the second etching tank 23, as shown in FIG. 2I; and removing the first filling layer 22 and the second filling layer 26 along the opening 45 to form the capacitor hole 35, as shown in FIG. 2J.

Specifically, an appropriate material can be selected for the first filling layer 22 and the second filling layer 26, so as to remove the first filling layer 22 and the second filling layer 26 through selective etching, and connect the first etching tank 21 and the second etching tank 23 inside the initial substrate 20.

In some embodiments, the forming, above the initial substrate 20, a patterned mask layer that includes a plurality of openings 45 exposing an overlapping region of the first etching tank 21 and the second etching tank 23 specifically includes:

forming a first mask sublayer 27 above the initial substrate 20, as shown in FIG. 2E;

etching the first mask sublayer 27 to form a plurality of first sub-openings 28 exposing the first filling layer 22, where the first sub-openings 28 each extend along the first direction D1, and the first sub-openings 28 are arranged in parallel along the second direction D2, as shown in FIG. 2F;

forming a third filling layer 39 that fills up the first sub-opening 28, as shown in FIG. 2G;

etching the first mask sublayer 27 and the third filling layer 39 to form a plurality of second sub-openings 30 exposing the initial substrate 20, where the second sub-openings 30 each extend along a direction parallel to the second direction D2, and the second sub-openings 30 are arranged in parallel along the first direction D1, as shown in FIG. 2H;

filling a second mask sublayer 33 in the second sub-opening 30 to form the mask layer including the second mask sublayer 33 and a remaining part of the first mask sublayer 27, where the mask layer includes a plurality of openings 45 exposing the third filling layer 39, as shown in FIGS. 2I; and removing the third filling layer 39 along the opening 45 to expose the overlapping region of the first etching tank 21 and the second etching tank 23.

Specifically, after the second filling layer 26 that fills up the second etching tank 23 and the recess 24 is formed, a hard mask material such as silicon nitride or an organic mask material such as carbon is deposited on the top surface of the initial substrate 20 to form the first mask sublayer 27, as shown in FIG. 2E. The first mask sublayer 27 is used as a mask for removing the first filling layer 22 and the second filling layer 26 subsequently, and is further configured to support the first isolation column 31 between the adjacent ones of the second etching tanks 23 to avoid tip-over or collapse in a subsequent process for removing the first filling layer 22 and the second filling layer 26. Then, the first mask sublayer 27 can be etched by etching a same mask that forms the first etching tank 21, to form the first sub-openings 28 exposing the first filling layer 22, where the first sub-openings 28 each extend along the first direction D1, and the first sub-openings 28 are arranged in parallel along the second direction D2, as shown in FIG. 2F. After that, the first sub-opening 28 is filled to form the third filling layer 39, as shown in FIG. 2G. Then, the first mask sublayer 27 and the third filling layer 39 are etched to form the second sub-openings 30 exposing the initial substrate 20, where the second sub-openings 30 each extend along the direction parallel to the second direction D2, and the second sub-openings 30 are parallel to each other and spaced apart along the first direction D1, as shown in FIG. 2H. The second mask sublayer 33 made of a nitride material (for example, a silicon nitride material) is filled in the second sub-opening 30 to form the mask layer including the second mask sublayer 33 and the remaining part of the first mask sublayer 27. In the direction parallel to the top surface of the initial substrate 20, the remaining part of the first mask sublayer 27 intersects the second mask sublayer 33 to form the openings 45 exposing the third filling layer 39, as shown in FIG. 2I. The third filling layer 39, the first filling layer 22, and the second filling layer 26 are removed along the opening 45 by using the etching process, to connect the first etching tank 21 and the second etching tank 23 inside the initial substrate 20 to form the capacitor hole 35, as shown in FIG. 2J.

In an embodiment, the first filling layer 22, the second filling layer 26, and the third filling layer 39 are made of a same material. For example, the first filling layer 22, the second filling layer 26, and the third filling layer 39 are made of the silicon dioxide, so as to remove the first filling layer 22, the second filling layer 26, and the third filling layer 39 at the same time by using a one-step etching process. In this way, a manufacturing process of the memory is further simplified.

Step S13: Form an isolation layer that connects the adjacent ones of the recesses 24 and fills up the recesses 24, and use the initial substrate 20 remaining below the isolation layer as the substrate 25, as shown in FIG. 2M.

In some embodiments, the initial substrate 20 remaining between adjacent ones of the capacitor holes 35 is used as the first isolation column 31, and the initial substrate 20 remaining between the adjacent ones of the recesses 24 is used as the second isolation column 32, as shown in FIG. 2J; and in the first direction D1, a width of the second isolation column 32 is ½ to ⅓ of a width of the first isolation column 31, and in the second direction D2, a width of the second isolation column 32 is equal to a width of the first isolation column 31.

Specifically, the inner diameter of the recess 24 is set to be greater than an inner diameter of the capacitor hole 35 above the recess 24, such that the width of the second isolation column 32 between the adjacent ones of the recesses 24 in the first direction D1 is less than the width of the first isolation column 31 between the adjacent ones of the capacitor holes 35 in the first direction. In this way, the second isolation column 32 can be fully modified later, so as to fully isolate the substrate 25 and a capacitor later. In addition, the width of the second isolation column 32 should not be too small. If the width of the second isolation column 32 is too small, the first isolation column 31 above the second isolation column 32 cannot be supported stably.

Figure 2K:
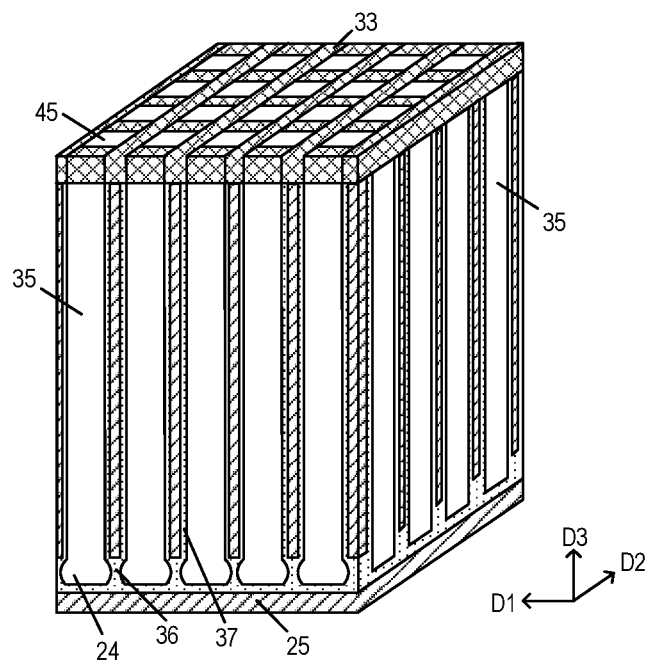
Figure 2L:
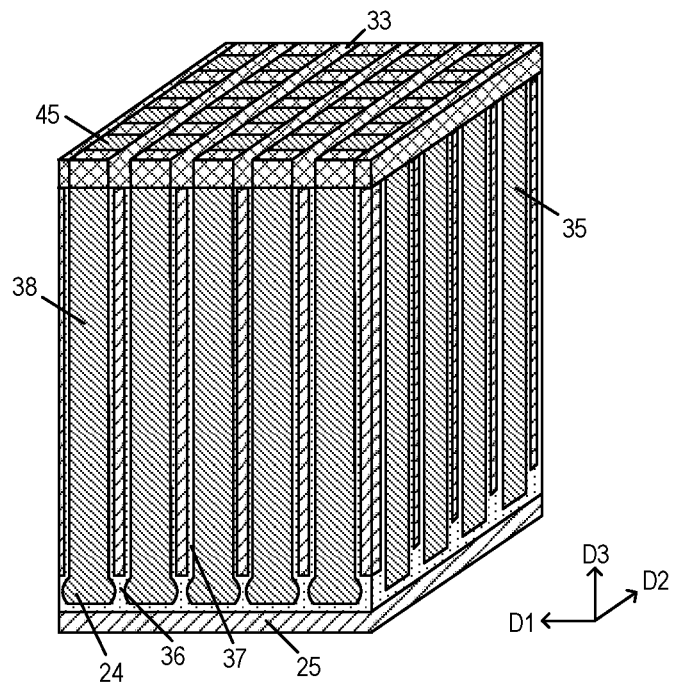
Figure 2M:
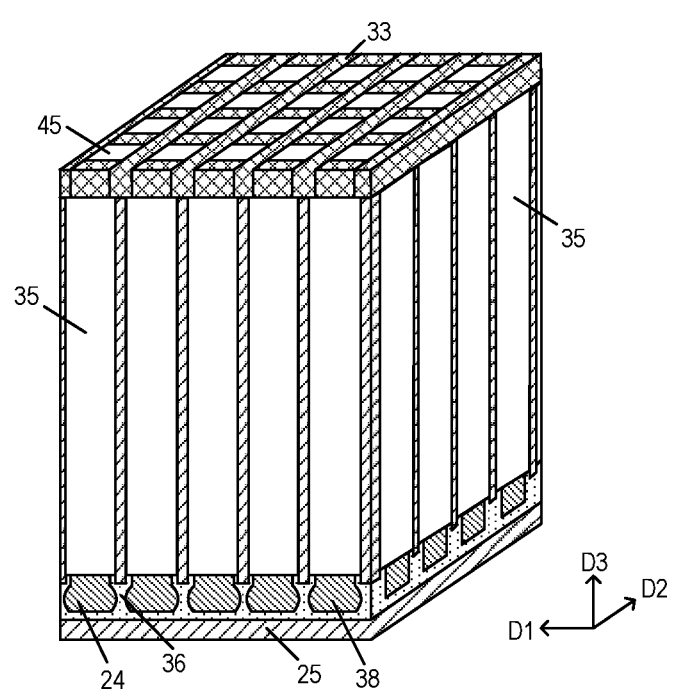

In some embodiments, the forming an isolation layer that connects adjacent ones of the recesses 24 and fills up the recesses 24 specifically includes:

oxidizing a part of the first isolation column 31 and the whole second isolation column 32 along the opening 45 to form an isolation sidewall 37 on a sidewall of the capacitor hole 35 and form a first isolation sublayer 36 between the adjacent ones of the recesses 24, as shown in FIG. 2K; and depositing a second isolation sublayer 38 in the recess 24 along the opening 45 to form the isolation layer including the first isolation sublayer 36 and the second isolation sublayer 38, as shown in FIG. 2M.

In some embodiments, the initial substrate 20 is made of silicon, and the first isolation sublayer 36 and the second isolation sublayer 38 are made of the silicon dioxide.

The following provides description by using an example in which the initial substrate 20 is made of the silicon, and the first isolation sublayer 36 and the second isolation sublayer 38 are made of the silicon dioxide. For example, in-situ oxidation (for example, in-situ steam generation) is performed on the first isolation column 31, the second isolation column 32, and a part of the initial substrate 20 at the bottom of the recess 24. The width of the first isolation column 31 in the first direction D1 is greater than that of the second isolation column 32 in the first direction D1. Therefore, oxidation parameters (for example, oxidation time and an oxidant dosage) can be controlled to completely oxidize the second isolation column 32 and oxidize only a surface of the first isolation column 31, so as to form the isolation sidewall 37 covering the sidewall of the capacitor hole 35, and the first isolation sublayer 36 located between the adjacent ones of the recesses 24 and covering a bottom surface of the recess 24, as shown in FIG. 2K. Then, a silicon dioxide material is deposited in the capacitor hole 35 and the recess 24 along the opening 45 to form the second isolation sublayer 38 that fills up the opening 45, the capacitor hole 35, and the recess 24, as shown in FIG. 2L. After that, the second isolation sublayer 38 is partially etched back, the isolation sidewall 37 is partially removed to expose the first isolation column 31, and the recess 24 is filled up with a remaining part of the second isolation sublayer 38, as shown in FIG. 2M.

In some embodiments, the depositing a second isolation sublayer 38 in the recess 24 along the opening 45 specifically includes:

depositing the second isolation sublayer 38 in the recess 24 and at the bottom of the capacitor hole 35 along the opening 45, such that a top surface of the second isolation sublayer 38 is located above a bottom surface of the first isolation column 31.

Specifically, when the second isolation sublayer 38 is partially etched back, a parameter condition of the back etching is controlled such that a top surface of the remaining part of the second isolation sublayer 38 is located above the bottom surface of the first isolation column 31, so as to fully isolate adjacent capacitors and avoid electric leakage between the adjacent capacitors.

This specific implementation is described by using an example in which the second isolation column 32 is oxidized to form the first isolation sublayer 36. In other specific implementations, another modification manner can alternatively be used to process the second isolation column 32 to form the first isolation sublayer 36. The another modification manner may be, but not limited to, doping.

Step S14: Form the capacitor in the capacitor hole 35, as shown in FIG. 2O.

Figure 2N:
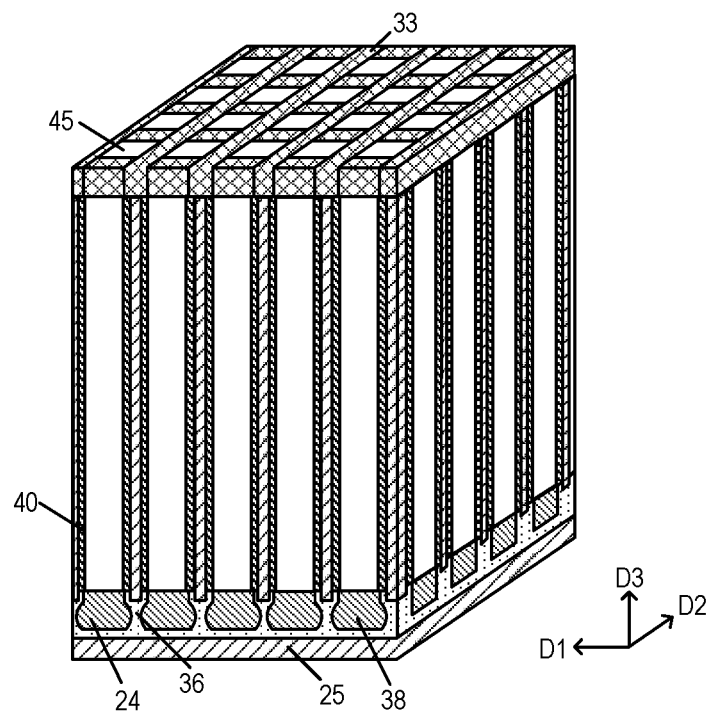
Figure 2O:
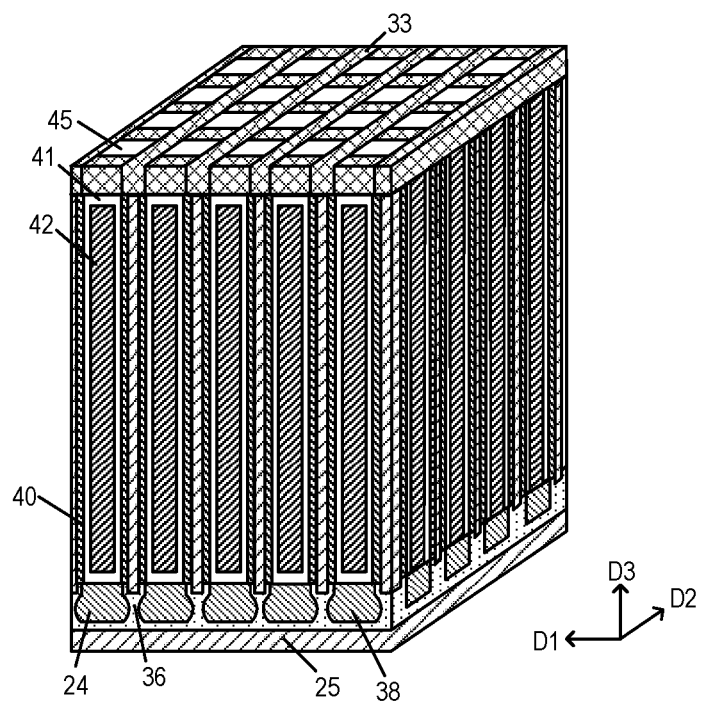

In some embodiments, the forming the capacitor in the capacitor hole 35 specifically includes:

removing the isolation sidewall 37;

forming a first electrode 40 covering the sidewall of the capacitor hole 35, as shown in FIG. 2N;

forming a dielectric layer 41 covering a surface of the first electrode 40, a top surface of the isolation layer, and a bottom surface of the mask layer; and forming a second electrode 42 covering the dielectric layer 41 to form the capacitor including the first electrode 40, the dielectric layer 41, and the second electrode 42, as shown in FIG. 2O.

Specifically, the atomic layer deposition process can be used to selectively deposit a first conductive material on the sidewall of the capacitor hole 35 rather than on a bottom surface of the capacitor hole 35. In this way, there is no need to remove the first conductive material at the bottom of the capacitor hole, which helps to further simplify the forming process of the memory. Then, the dielectric layer 41 is deposited on the surface of the first electrode 40, the top surface of the isolation layer, and the bottom surface of the mask layer by using the atomic layer deposition process. After that, the second electrode 42 covering the dielectric layer 41 is formed. The first electrode 40 and the second electrode 42 may be made of Ru, $RuO_2$, or TiN to enhance conductivity of the capacitor. The dielectric layer 41 may be made of one of STO ($SrTiO_3$), $Al_2O_3$, ZrO, and $HfO_2$, or a combination of more than two of them.

Figure 2P:
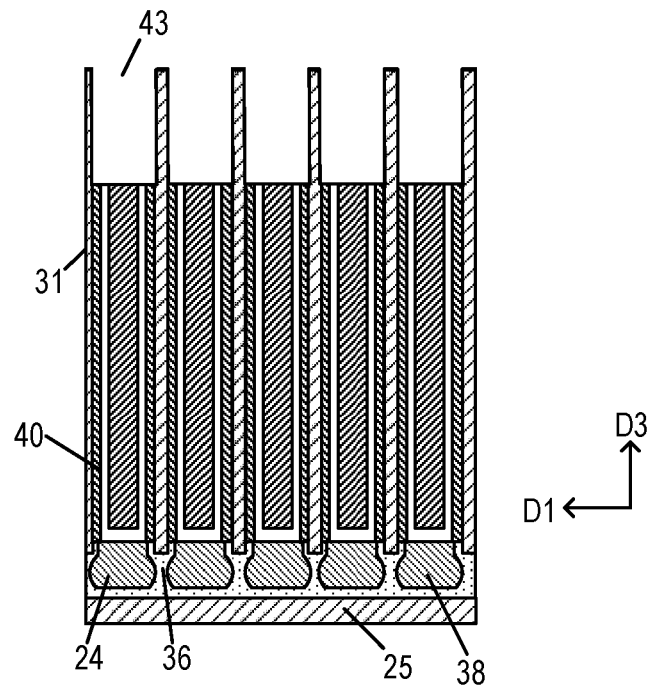
Figure 2Q:
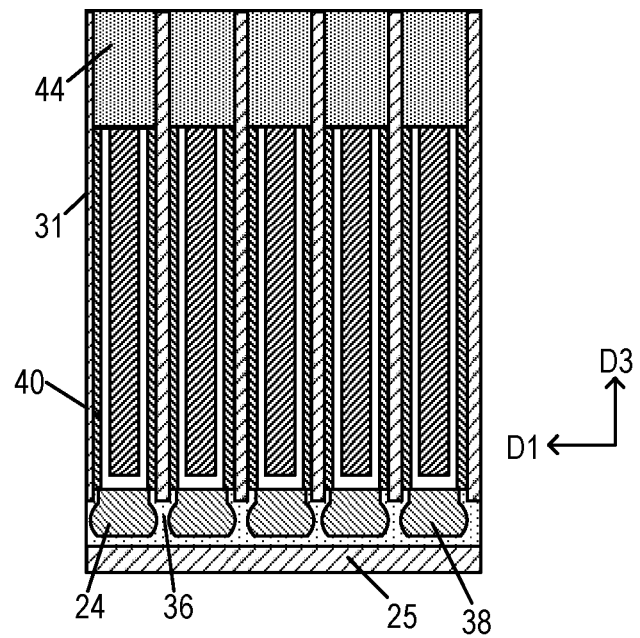
Figure 3:
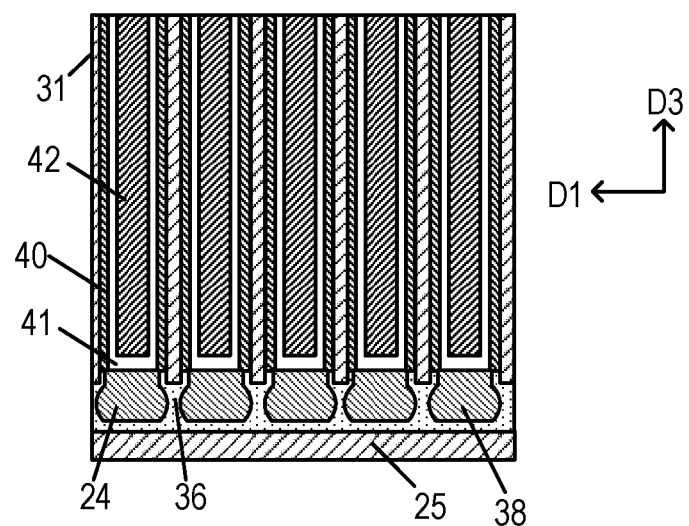

In some embodiments, after the forming a second electrode 42 covering the dielectric layer 41, the memory forming method further includes the following steps:

removing the mask layer, and partially etching back the first electrode 40, the dielectric layer 41, and the second electrode 42 to expose an upper part of the first isolation column 31, as shown in FIG. 2P, where FIG. 2P is a schematic cross-sectional view of a plane on which the first direction D1 and the second direction D3 in FIG. 2O are located; and forming a coating layer 44 wrapping the exposed part of the first isolation column 31, as shown in FIG. 2Q.

In some embodiments, after the forming a coating layer 44 wrapping the exposed part of the first isolation column 31, the memory forming method further includes the following step:

doping the first isolation column 31 in the coating layer 44 to form an active region of a transistor.

Specifically, after the capacitor is formed, the mask layer is removed, the capacitor is partially etched back to expose the upper part of the first isolation column 31 by a preset height, and a spacing slot 43 is formed between adjacent first isolation columns 31, as shown in FIG. 2P. Then, the insulating material such as the silicon dioxide is deposited in the spacing slot 43 to form the coating layer 44 that fills up the spacing slot 43, as shown in FIG. 2Q. After that, the first isolation column 31 wrapped by the coating layer 44 is doped to form the active region to form a TOC structure. The active region includes a trench region, and a source region and a drain region that are distributed on two opposite sides of the trench region along a direction perpendicular to a top surface of the substrate 25 (for example, the third direction D3 in FIG. 2Q). The drain region is electrically connected to the capacitor, and the source region is used to connect a bit line, such that the bit line can be disposed above the capacitor. This reduces resistance of the bit line, and can make the manufacturing process of the memory easier, reduce area occupied by a single memory, and improve integration of the memory.

The specific implementations further provide a memory. FIG. 3 is a schematic structural diagram of a memory according to a specific implementation of the present disclosure. The memory provided in this specific implementation may be formed by using the memory forming method shown in FIG. 1 and FIG. 2A to FIG. 2Q. As shown in FIG. 3, the memory includes:

a substrate 25;

an isolation layer located above the substrate 25; and a capacitor array located above the isolation layer and including a plurality of capacitors, where the capacitors each include a first electrode 40 extending along a direction perpendicular to a top surface of the substrate 25, a dielectric layer 41 covering a surface of the first electrode 40, and a second electrode 42 covering a surface of the dielectric layer 41.

In some embodiments, the memory further includes:

a first isolation column 31 located between two adjacent ones of the capacitors; where the isolation layer includes a first isolation sublayer 36 between the first isolation column 31 and the substrate 25, and a second isolation sublayer 38 below the capacitor.

In some embodiments, the first isolation sublayer 36 and the second isolation sublayer 38 are made of a same material.

In some embodiments, the substrate 25 and the first isolation column 31 are made of silicon, and the first isolation sublayer 36 and the second isolation sublayer 38 are made of silicon dioxide.

In some embodiments, the first electrode 40 covers a sidewall of the first isolation column 31, and the dielectric layer 41 covers the surface of the first electrode 40 and a surface of the second isolation sublayer 38.

In some embodiments, a bottom surface of the first isolation column 31 is located below a bottom surface of the first electrode 40.

In some embodiments, the memory further includes:

a trench region located above the first isolation column 31; and a gate disposed around the trench region.

According to the memory and the memory forming method provided in some embodiments of the specific implementations, before the capacitor is formed, the recess is formed below the capacitor hole for forming the capacitor, and after the isolation layer that connects the adjacent ones of the recesses and fills up the recesses is formed, the capacitor is formed in the capacitor hole above the isolation layer, to electrically isolate the bottom of the capacitor from the substrate through the isolation layer. This reduces and even avoids electric leakage at the bottom of the capacitor, so as to improve an electrical property of the memory. In addition, compared with a method for forming the isolation layer directly on the substrate by using a deposition or oxidation process, the memory forming method provided in the present disclosure integrates a forming process of the capacitor hole and a forming process of the isolation layer, such that the forming process of the isolation layer can be carried out while the capacitor hole is formed. The isolation layer is directly formed below the capacitor to ensure that the isolation layer can be fully aligned with the bottom of the capacitor. This simplifies a manufacturing process of the memory and reduces process difficulty of the memory, and can further improve an effect of electrical isolation between the capacitor and the substrate.

The above described are merely preferred implementations of the present disclosure. It should be noted that several improvements and modifications may further be made by a person of ordinary skill in the art without departing from the principle of the present disclosure, and such improvements and modifications should also be deemed as falling within the protection scope of the present disclosure.

The invention claimed is:

1. A memory forming method, comprising:
providing an initial substrate;
etching the initial substrate to form a plurality of capacitor holes and a plurality of recesses that are connected to the capacitor holes in a one-to-one corresponding manner and located below the capacitor holes;
forming an isolation layer that connects adjacent ones of the recesses and fills up the recesses, and using the initial substrate remaining below the isolation layer as a substrate; and
forming a respective capacitor in each of the plurality of capacitor holes.

2. The memory forming method according to claim 1, wherein forming a plurality of capacitor holes and a plurality of recesses that are connected to the capacitor holes in a one-to-one corresponding manner and located below the capacitor holes specifically comprises:
etching the initial substrate to form a plurality of first etching tanks, wherein the first etching tanks each extend along a first direction, the first etching tanks are parallel to each other and spaced apart in a second direction, the first direction and the second direction are parallel to a top surface of the initial substrate, and the first direction is orthogonal to the second direction;
etching the initial substrate to form a plurality of second etching tanks, wherein the second etching tanks each extend along the second direction, and the second etching tanks are parallel to each other and spaced apart in the first direction;
etching the initial substrate at a bottom of the second etching tank to form, in the first direction, the recess whose width is greater than a width of the second etching tank; and
connecting the first etching tank and the second etching tank to form the respective capacitor hole.

3. The memory forming method according to claim 2, wherein before forming a plurality of second etching tanks, the memory forming method further comprises:
forming a first filling layer that fills up the first etching tank.

4. The memory forming method according to claim 3, wherein forming the recess whose width is greater than a width of the second etching tank specifically comprises:
etching the initial substrate at the bottom of the second etching tank by a Bosch etching process, to form the recess.

5. The memory forming method according to claim 3, wherein the connecting the first etching tank and the second etching tank to form the respective capacitor hole specifically comprises:
forming a second filling layer that fills up the second etching tank and the recess;
forming, above the initial substrate, a patterned mask layer that comprises a plurality of openings exposing an overlapping region of the first etching tank and the second etching tank; and
removing the first filling layer and the second filling layer along the opening to form the respective capacitor hole.

6. The memory forming method according to claim 5, wherein the forming, above the initial substrate, a patterned mask layer that comprises a plurality of openings exposing an overlapping region of the first etching tank and the second etching tank specifically comprises:
forming a first mask sublayer above the initial substrate;
etching the first mask sublayer to form a plurality of first sub-openings exposing the first filling layer, wherein the first sub-openings each extend along the first direction, and the first sub-openings are spaced apart along the second direction;
forming a third filling layer that fills up the first sub-opening;
etching the first mask sublayer and the third filling layer to form a plurality of second sub-openings exposing the initial substrate, wherein the second sub-openings each extend along a direction parallel to the second direction, and the second sub-openings are spaced apart along the first direction;
filling a second mask sublayer in the second sub-opening to form the mask layer comprising the second mask sublayer and a remaining part of the first mask sublayer, wherein the mask layer comprises a plurality of openings exposing the third filling layer; and
removing the third filling layer along the opening to expose the overlapping region of the first etching tank and the second etching tank.

7. The memory forming method according to claim 6, wherein the initial substrate remaining between adjacent ones of the capacitor holes is used as a first isolation column, and the initial substrate remaining between the adjacent ones of the recesses is used as a second isolation column; and
in the first direction, a width of the second isolation column is ½ to ⅓ of a width of the first isolation column, and in the second direction, a width of the second isolation column is equal to a width of the first isolation column.

8. The memory forming method according to claim 7, wherein the forming an isolation layer that connects adjacent ones of the recesses and fills up the recesses specifically comprises:
oxidizing a part of the first isolation column and the whole second isolation column along the opening to form an isolation sidewall on a sidewall of each of the plurality of capacitor holes and form a first isolation sublayer between the adjacent ones of the recesses; and
depositing a second isolation sublayer in the recess along the opening to form the isolation layer comprising the first isolation sublayer and the second isolation sublayer.

9. The memory forming method according to claim 8, wherein the depositing a second isolation sublayer in the recess along the opening specifically comprises:
depositing the second isolation sublayer in the recess and at a bottom of each of the plurality of capacitor holes along the opening, such that a top surface of the second isolation sublayer is located above a bottom surface of the first isolation column.

10. The memory forming method according to claim 8, wherein the initial substrate is made of silicon, and the first isolation sublayer and the second isolation sublayer are made of silicon dioxide.

11. The memory forming method according to claim 8, wherein the forming a respective capacitor in each of the plurality of capacitor holes specifically comprises:
removing the isolation sidewall;
forming a first electrode covering the sidewall of each of the plurality of capacitor holes;
forming a dielectric layer covering a surface of the first electrode, a top surface of the isolation layer, and a bottom surface of the mask layer; and
forming a second electrode covering the dielectric layer to form the capacitor comprising the first electrode, the dielectric layer, and the second electrode.

12. The memory forming method according to claim 11, wherein after the forming a second electrode covering the dielectric layer, the memory forming method further comprises:
   removing the mask layer, and partially etching back the first electrode, the dielectric layer, and the second electrode to expose an upper part of the first isolation column; and
   forming a coating layer wrapping the exposed part of the first isolation column.

13. The memory forming method according to claim 12, wherein after the forming a coating layer wrapping the exposed part of the first isolation column, the memory forming method further comprises:
   doping the first isolation column in the coating layer to form an active region of a transistor.

14. A memory, comprising:
   a substrate;
   an isolation layer, located above the substrate; and
   a capacitor array, located above the isolation layer and comprising a plurality of capacitors, wherein the capacitors each comprise a first electrode extending along a direction perpendicular to a top surface of the substrate, a dielectric layer covering a surface of the first electrode, and a second electrode covering a surface of the dielectric layer;
   a first isolation column, located between two adjacent ones of the capacitors; wherein the isolation layer comprises a first isolation sublayer between the first isolation column and the substrate, and a second isolation sublayer below the capacitor;
   wherein the substrate and the first isolation column are made of silicon, and the first isolation sublayer and the second isolation sublayer are made of silicon dioxide.

15. The memory according to claim 14, wherein the first electrode covers a sidewall of the first isolation column, and the dielectric layer covers the surface of the first electrode and a surface of the second isolation sublayer.

16. The memory according to claim 14, wherein a bottom surface of the first isolation column is located below a bottom surface of the first electrode.

17. The memory according to claim 14, the memory further comprises:
   a trench region, located above the first isolation column; and
   a gate, disposed around the trench region.

* * * * *